United States Patent
Henley et al.

(10) Patent No.: US 6,265,328 B1
(45) Date of Patent: Jul. 24, 2001

(54) WAFER EDGE ENGINEERING METHOD AND DEVICE

(75) Inventors: Francois J. Henley, Los Gatos; Nathan Cheung, Albany; William G. Eng, Milpitas; Igor J. Malik, Palo Alto, all of CA (US)

(73) Assignee: Silicon Genesis Corporation, Campbell, CA (US)

( * ) Notice: Subject to any disclaimer, the term of this patent is extended or adjusted under 35 U.S.C. 154(b) by 0 days.

(21) Appl. No.: 09/239,477

(22) Filed: Jan. 28, 1999

Related U.S. Application Data

(60) Provisional application No. 60/073,215, filed on Jan. 30, 1998.

(51) Int. Cl.[7] ........................................... B05C 11/02
(52) U.S. Cl. ................. 438/782; 438/694; 438/778; 438/783
(58) Field of Search .................... 438/778, 782, 438/783, 510, 526, 694

(56) References Cited

U.S. PATENT DOCUMENTS 5,897,379  4/1999  Ulrich et al. .
6,033,988  3/2000  Hirano .

FOREIGN PATENT DOCUMENTS 8-107091  * 4/1996  (JP) ........................................ 21/304

* cited by examiner

Primary Examiner—Charles Bowers
Assistant Examiner—Lisa Kilday
(74) Attorney, Agent, or Firm—Townsend and Townsend and Crew LLP

(57) ABSTRACT

The present invention provides an apparatus (400) (500) for abating edge material from a substrate, e.g., SOI. The apparatus includes, among other elements, a housing and a rotatable member (401) coupled to the housing. The rotatable member is a susceptor, which is relatively flat for securing a substrate. A movable dispensing head (421) is coupled to the housing and is overlying the rotatable member. The movable dispensing head (421) is operable to emit a stream of directed fluid to one or more locations of the susceptor. The apparatus also includes a fluid source, which is coupled to the movable dispensing head. The fluid source provides fluid to ablate material from the substrate.

17 Claims, 5 Drawing Sheets

WAFER EDGE ENGINEERING METHOD AND DEVICE

This application claim benefit to provisional application 60/073,215 filed Jan. 30, 1998.

BACKGROUND OF THE INVENTION

The present invention relates to the manufacture of integrated circuits. More particularly, the present invention provides a technique for forming substrates using a novel edge engineering technique. This invention is illustrated using, for example, silicon-on-insulator ("SOI") wafers, but can be applied to other types of substrates such as bulk substrates, patterned substrates, multi-layered substrates, and others.

Integrated circuits are fabricated on chips of semiconductor material. These integrated circuits often contain thousands, or even millions, of transistors and other devices. In particular, it is desirable to put as many transistors as possible within a given area of semiconductor material because more transistors typically provide greater functionality, and a smaller chip means more chips per wafer and lower costs. From the development of the integrated circuit at Fairchild Semiconductor by Robert Noyce and Jack Kilby at Texas Instruments to modern day times, industry has always attempted to fabricate more and more devices on a given area of silicon.

Some integrated circuits are fabricated on a slice or wafer, of single-crystal (monocrystalline) silicon, commonly termed a "bulk" silicon wafer. Devices on such "bulk" silicon wafer typically are isolated from each other. A variety of techniques have been proposed or used to isolate these devices from each other on the bulk silicon wafer, such as a local oxidation of silicon ("LOCOS") process, trench isolation, and others. These techniques, however, are not free from limitations. For example, conventional isolation techniques consume a considerable amount of valuable wafer surface area on the chip, and often generate a non-planar surface as an artifact of the isolation process. Either or both of these considerations generally limit the degree of integration achievable in a given chip. Additionally, trench isolation often requires a process of reactive ion etching, which is extremely time consuming and can be difficult to achieve accurately.

An approach to achieving very-large scale integration ("VLSI") or ultra-large scale integration ("ULSI") uses a semiconductor- or silicon-on-insulator ("SOI") wafer. An SOI wafer typically has a layer of silicon on top of a layer of an insulator material. A variety of techniques have been proposed or used for fabricating the SOI wafer. These techniques include, among others, growing a thin layer of silicon on a sapphire substrate, bonding a layer of silicon to an insulating substrate, and forming an insulating layer beneath a silicon layer in a bulk silicon wafer, which is commonly termed SIMOX. In an SOI integrated circuit, essentially complete device isolation is often achieved using conventional device processing methods by surrounding each device, including the bottom of the device, with an insulator. An advantage SOI wafers have over bulk silicon wafers is that the area required for isolation between devices on an SOI wafer is less than the area typically required for isolation on a bulk silicon wafer.

SOI offers other advantages over bulk silicon technologies as well. For example, SOI offers a simpler fabrication sequence compared to a bulk silicon wafer. Devices fabricated on an SOI wafer may also have better radiation resistance, less photo-induced current, and less cross-talk than devices fabricated on bulk silicon wafers. Many problems, however, that have already been solved regarding fabricating devices on bulk silicon wafers remain to be solved for fabricating devices on SOI wafers.

That is, numerous limitations exist in the manufacture of SOI wafers. In general, some techniques for fabricating SOI can produce SOI wafers with substantially defect free layers having relatively low thickness variation, but these techniques often produce SOI wafers in relatively low yield and at high cost, as compared to bulk wafers. Other techniques can produce high yields. These techniques, however, often produce poor quality films.

From the above, it is seen that an improved technique for manufacturing a substrate such as, for example, an SOI wafer and others is highly desirable.

SUMMARY OF THE INVENTION

According to the present invention, a technique including a method and device for fabricating and shaping an exclusion region or for clearing layer(s) on a substrate is provided. In an exemplary embodiment, the present invention uses a stream of fluid to selectively remove or "ablate" a portion of a film of material on a substrate. In other embodiments, the present invention can use a directional beam of plasma or "plug" of plasma to ablate a portion of a film of a material on a substrate. In some of these embodiments, the substrate is rotated to expose all locations of an outer periphery of the substrate to the stream of fluid or plug of plasma for ablation purposes.

In a specific embodiment, the present invention provides a novel method for fabricating a substrate, e.g., SOI. The method includes a step of providing a substrate, which has an overlying thickness of material (e.g., $SiO_2$, silicon, germanium) on the substrate. The thickness of material has a surface thereon, which is substantially planar. The thickness of material also extends to an outer periphery of the substrate. The method also includes a step of rotating the substrate about a center region (e.g., geometric center point) of the substrate such that the surface moves in parallel alignment relative to a fixed plane. A stream of material (i.e., acid, base, abrasive) is applied to an outer portion of the thickness of material as the substrate rotates to ablate an outer peripheral portion of the thickness of material that contacts the stream of material.

In an alternative embodiment, the present invention provides an apparatus for abating edge material from a substrate, e.g., SOI. The apparatus includes, among other elements, a housing and a rotatable member coupled to the housing. The rotatable member is a susceptor or platen, which has a relatively flat surface for securing a substrate. A movable dispensing head is coupled to the housing and is overlying the rotatable member, which has a workpiece (e.g., substrate, SOI) thereon. The movable dispensing head is operable to emit a stream of directed fluid to one or more locations of the susceptor. The apparatus also includes a fluid source, which is coupled to the movable dispensing head. The fluid source provides fluid to ablate material from the substrate. In a specific embodiment, the fluid can be a combination of compounds to form an acidic fluid, which etches or ablates a portion of the rotating substrate.

Numerous advantages are achieved over conventional techniques by way of the present invention. In some embodiments, the present invention provides a technique that is substantially free from the use of masking layers or photomasking layers. By way of substantially no photomasking, the present invention is cleaner and more cost effective than conventional techniques that require the use of photomasks. It also eliminates the possibility of leaving hydrocarbon residues after photoresist removal. The present invention can also be applied during and after a number of process steps. Accordingly, the present invention is more flexible and cleaner than pre-existing techniques. In other embodiments, the present invention provides for the accurate control of ablated regions to form and shape exclusionary regions. These and other advantages or benefits are described throughout the present specification and more particularly below.

These and other embodiments of the present invention, as well as other advantages and features, are described in more detail in conjunction with the text below and attached Figs.

DESCRIPTION OF THE SPECIFIC EMBODIMENTS

According to the present invention, a technique including, a method and device, for fabricating an exclusion region or clearing layer(s) on a substrate is provided. In an exemplary embodiment, the present invention uses a stream of fluid to selectively remove or "ablate" a portion of a film of material on a substrate. Other embodiments may use plasma processing, wet processing, or the like. The present invention also provides a novel system for ablating portions of a substrate using a stream of fluid. The stream of fluid can chemically or physically remove or ablate the material portion.

Silicon-On-Insulator Substrates

Figure 1:
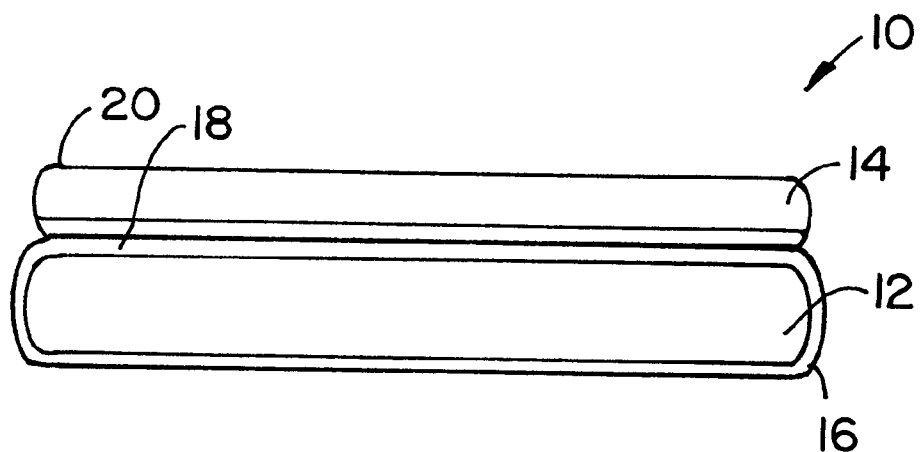
FIG. 1 is a simplified cross-sectional view diagram of an SOI wafer according to an embodiment of the present invention.

FIG. 1 is a simplified cross-sectional view diagram of a partially completed SOI wafer 10 according to the present invention. This diagram is merely an illustration and should not limit the scope of the claims herein. One of ordinary skill in the art would recognize other modifications, alternatives, and variations. The SOI wafer 10 includes a bulk substrate 12, which can be made of a variety of materials such as silicon, glass, and others. The bulk substrate can be also termed a handle wafer, target substrate, and the like. Overlying the bulk substrate 12 is an insulating layer 16, which is often made of oxide, but can also be made of other materials such as silicon nitride, multi-layered materials, and the like. A film of semiconductor material 14 (e.g., single crystal silicon) overlies the insulating layer 18. The SOI wafer can be made by way of a variety of techniques including a "blister" process such as Smart Cut™ or preferably a controlled cleaving process.

An example of the blister technique for removing a film of material from a donor substrate is described in U.S. Pat. No. 5,374,564, entitled, Process For The Production Of Thin Semiconductor Material Films, by Michel Bruel, issued Dec. 20, 1994 (the "Bruel" patent). The Bruel patent generally describes a process for globally raising the temperature of an implanted wafer to blister a film off of a wafer by way of expanding microbubbles. This technique can often form non-uniformities or surface roughness and imperfections in the wafer surface, which must be removed.

The controlled cleaving process is described in Henley et al., entitled A Controlled Cleavage Process And Resulting Device, filed May 12, 1997 ("Henley") Ser. No. 60/046,276 and hereby incorporated by reference for all purposes. The controlled cleaving process provides a more uniform surface on the film as compared to the blister method described by Bruel, noted above. Additionally, the controlled cleaving process produces a uniform layer, which has limited lateral roughness. SOI wafer 10 has a relatively smooth finish 20.

Figure 1A:
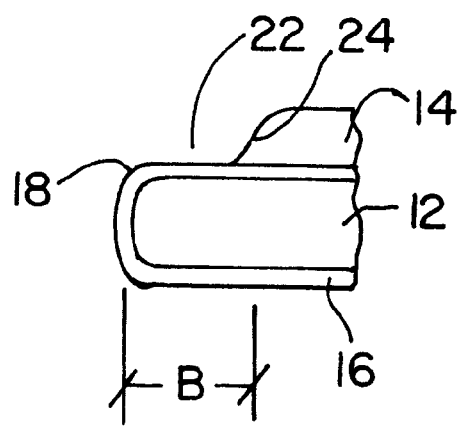

Before processing the SOI wafer, an edge region of wafer 10 should be removed or cleared. An example of a cleared edge region or "excluded" edge region or "exclusion" region is shown in FIG. 1A, for example. FIG. 1A is a simplified cross-sectional view diagram of an exclusion region 22 for an SOI wafer. The exclusion region 22 extends underlying a portion of layer 14 to insulating layer 18. That is, a portion of layer 14 is removed to form exclusion region 22.

In an embodiment for eight inch SOI substrates, the exclusion region can range in size and shape. Using for example a layer thickness of about 1000 Å, the exclusion region can range in length β from about 0 mm to about 5 mm, but is not limited to this range. The shape 24 of exclusion region 22 can also vary from a positively sloping edge toward an outer periphery of the wafer to a negatively sloping edge toward the periphery of the wafer. Alternatively, the edge can be substantially vertical or slightly tilted either negatively or positively. Of course, the particular size and shape of the exclusion region depends upon the application. A variety of techniques can be used to form exclusion region 22 according to the present invention. These techniques are shown below with reference to the remaining Figs.

Edge Engineering Embodiments

Figure 2:
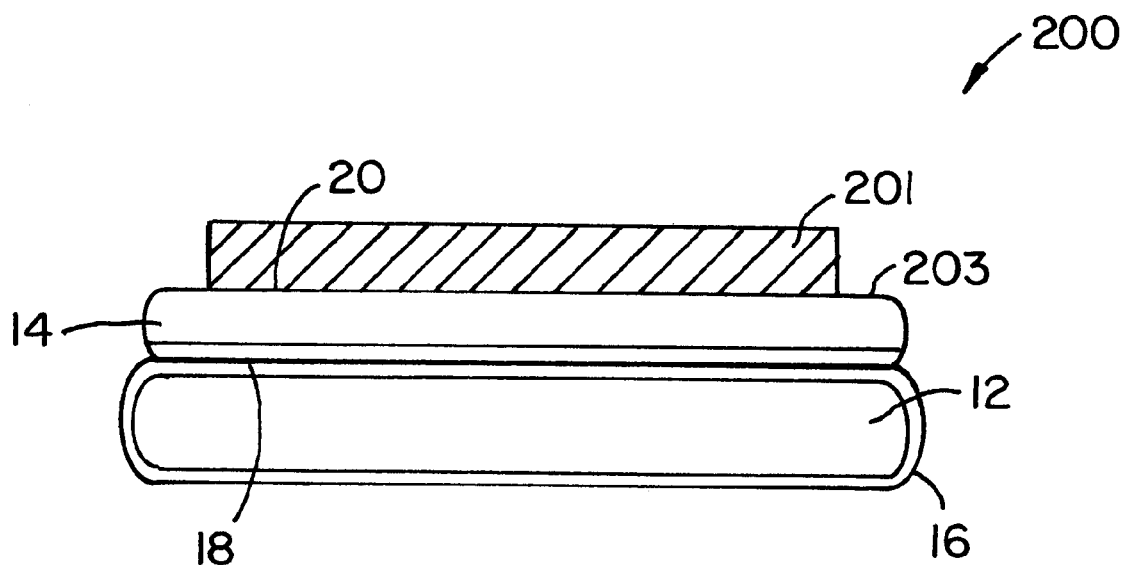
FIGS. 2–3 are simplified cross-sectional view diagrams of a masking method according to an embodiment of the present invention.
Figure 3:
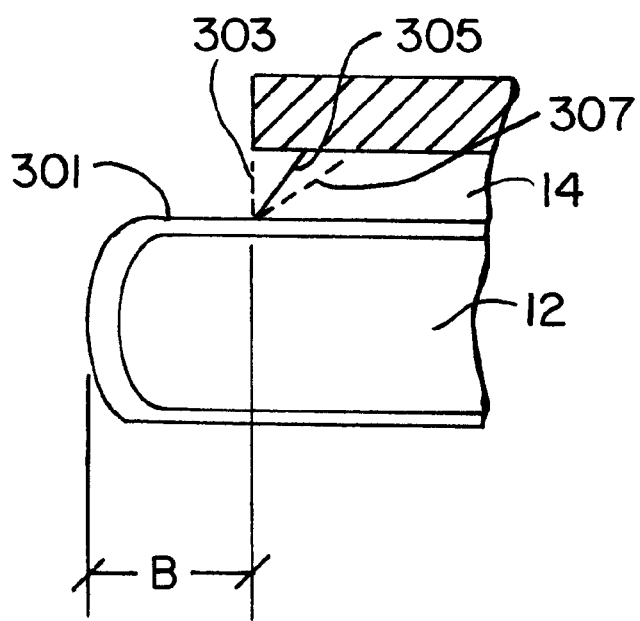

FIGS. 2–3 are simplified cross-sectional view diagrams of a masking method according to an embodiment the present invention. These diagrams are merely illustrations and should not limit the scope of the claims herein. One of ordinary skill in the art would recognize other modifications, alternatives, and variations. As merely an example, the present invention is applied to the manufacture of an SOI wafer 200, but can also be applied to a variety of other wafers or substrates. For easy cross-referencing like reference numerals are used in the present Figs. as the previous Figs. The SOI wafer 200 includes a bulk substrate 12, which can be made of a variety of materials such as silicon, glass, and others. The bulk substrate can be also termed a handle wafer, target substrate, and the like. Overlying the bulk substrate 12 is an insulating layer 16, which is often made of oxide, but can also be other materials such as silicon nitride, multi-layered materials, and the like. A film of semiconductor material 14 (e.g., single crystal silicon) overlies the insulating layer 18. The SOI wafer can be made by way of a variety of techniques including a "blister" process such as Smart Cut™ or preferably a controlled cleaving process.

A photomasking process is performed on SOI wafer 200 to form exclusion regions. The photomasking process generally uses steps of spin coating photoresist onto material 14. Patterning of the photoresist occurs using steps of baking, exposing, developing, and others. The patterned photoresist includes openings 203, which expose portions of material 14. The patterning process only exposes areas corresponding to exclusion regions, but are not limited to these regions in some embodiments.

A step of etching material 14 through openings 203 is used to remove selected portions of material 14. Etching can occur using a variety of techniques. For example, etching can occur by wet processing techniques using selective etchants, for example. These etchants can selectively remove material 14 but not remove insulating layer 18. Alternatively the etchants can remove both material 14 and insulating layer 18 and even cut into portions of bulk substrate 12. Alternatively, etching can occur using dry techniques. These dry techniques include reactive ion etching, plasma etching, and others. Similar to the wet etching techniques. dry etching can be selective between material 14 and insulating layer 18. Alternatively, dry etching can be used in a single step or multiple steps. In an embodiment for a silicon material 14, selective etchants are used. As merely an example, selective etchants include a combination of a hydrofluoric acid, acetic acid, and nitric acid.

FIG. 3 shows etched or exclusion region 301, which has been derived from the substrate of FIG. 2, for example. Etching occurs to provide one of numerous edge profiles according to the present invention. These profiles include an outwardly sloping edge profile 305, which can even have less slope 307 in some embodiments. Alternatively, etching can produce a substantially vertical edge profile 303, which has an angle of less than 5 degrees variation in other embodiments. Still further, etching can produce a negatively sloped edge profile. The type of profile used depends upon the application, however. In modifications to these embodiments, sidewalls can be formed on edges of the edge profiles. These sidewalls can be formed by oxidizing exposed regions of the edges to an oxygen bearing compound for a silicon material. Alternatively, sidewalls can be deposited on the edges using combinations of deposition and etching techniques. In an embodiment for eight inch SOI substrates, the exclusion region can range in size and shape. Using for example a material 14 thickness of about 1000 A, the exclusion region can range in length β from about 0 mm to about 5 mm, but is not limited to this range.

Figure 4:
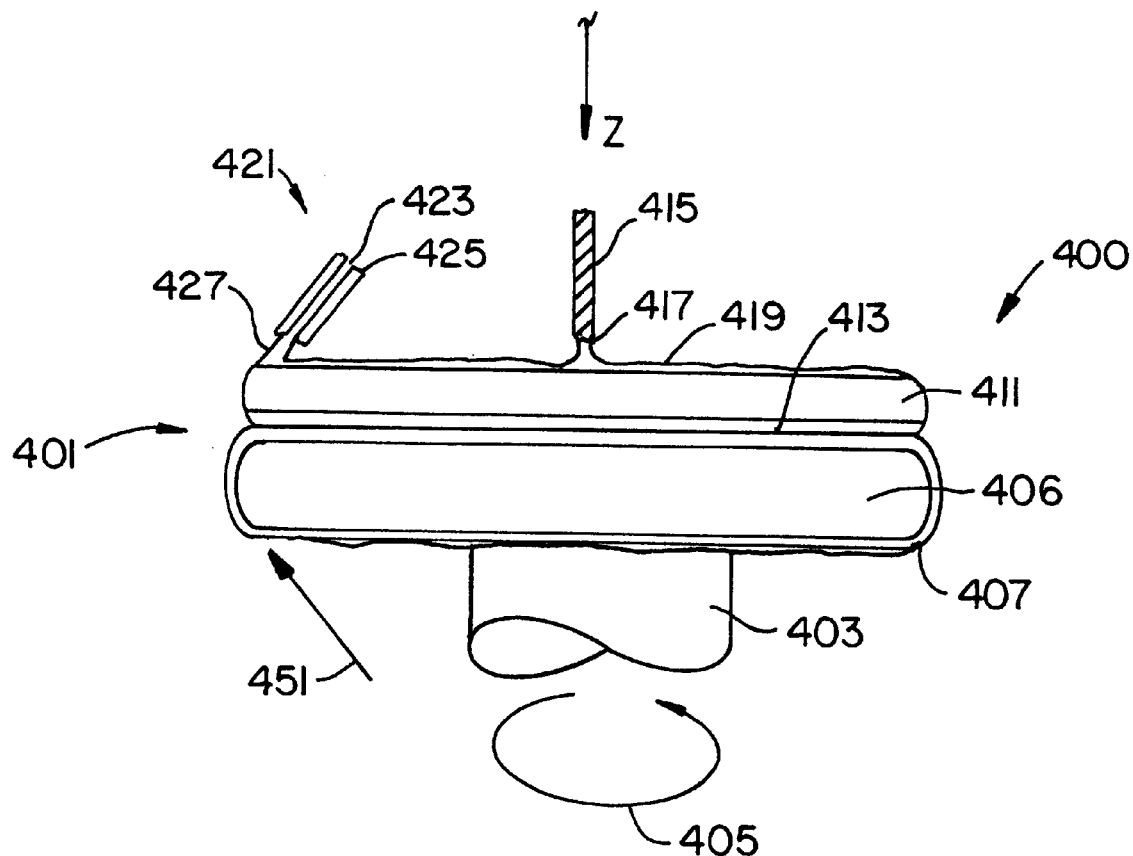
FIG. 4 is a simplified cross-sectional view diagram of an ablation method according to an embodiment of the present invention.

FIG. 4 is a simplified cross-sectional view diagram of a non-masking method using an ablation apparatus 400 according to an embodiment the present invention. This diagram is merely an illustration and should not limit the scope of the claims herein. One of ordinary skill in the art would recognize other modifications, alternatives, and variations. The ablation apparatus 400 includes a variety of elements such as a wafer (e.g., SOI), which is disposed on susceptor 403. Susceptor 403 is movable or rotates about a fixed axis z and about a fixed plane, which is parallel to an upper surface of the wafer.

The susceptor is coupled to a motor or drive which rotates the susceptor in a circular manner. The susceptor can be capable of rotating at speeds ranging from slow to fast. The susceptor also accelerate linearly, exponentially, or in a stepped manner to a steady state speed. The susceptor can also decelerate linearly, exponentially, or in a stepped manner to a steady state speed.

Susceptor also holds wafer 401 using a suitable technique such that the wafer does not fly off the susceptor during rotation. Preferably, the wafer is substantially stationary in the radial and z-direction during rotation. Additionally, susceptor has high accuracy in the z-direction at full speed. Susceptor also has high accuracy in the radial direction at full speed. Accordingly, susceptor is substantially stationary and stable during high rotation speeds, as well as low rotation speeds. In some embodiments, the susceptor is an electrostatic chuck, a vacuum chuck, or mechanical chuck.

Wafer 401 includes a bulk substrate 406, which can be made of a variety of materials such as silicon, glass, and others. The bulk substrate can be also termed a handle wafer, target substrate, and the like. Overlying the bulk substrate 406 is an insulating layer 407, which is often made of oxide, but can also be other materials such as silicon nitride, multi-layered materials, and the like. A film of semiconductor material 411 (e.g., single crystal silicon) overlies insulating layer 413. The SOI wafer can be made by way of a variety of techniques including a "blister" process such as Smart Cut™ or preferably a controlled cleaving process.

A fluid dispenser 415 is disposed overlying wafer 401. Fluid dispenser is movable, but is preferably overlying a center region of wafer 401, as shown. The fluid dispenser is movable in the radial, angular, and z-direction. Fluid dispenser supplies fluid 419 through nozzle 417. Fluid 417 can be a liquid, which adheres to a top surface of wafer 401. Fluid can be applied in a laminar manner or turbulent manner or combinations of laminar and turbulent flow. Alternatively, a spray of fluid can also be applied. Fluid dispenses can apply a variety of materials such as a protection material, a rinse material (e.g., water, DI water), a drying material, or the like.

An ablation tool 421 is disposed overlying a selected edge portion of the rotating wafer. The ablation tool 421 includes a variety of elements such as an inner flow region or orifice, which is coupled to a fluid source. The tool also includes an outer region 425. Fluid 427 is ejected or dispensed from orifice 423 to the edge portion of the rotating wafer. Fluid such as liquid can be applied in a laminar manner or turbulent manner or combinations of laminar and turbulent flow. Alternatively, a spray of fluid can also be applied.

To form an edge exclusion region, fluid 427 ablates a portion of the semiconductor material 411. Ablation occurs by etching selected spacial regions of wafer 401 by steps of directing fluid 427 at various angles and rotating wafer 401. In most embodiments, ablation occurs on substantially all peripheral portions of the semiconductor material by way of the rotating action, which exposes outer portions of the semiconductor material to the fluid. In applications where the semiconductor material is a silicon material, the fluid can be a selective etchant such as a combination of a hydrofluoric acid, acetic acid, and nitric acid.

Alternatively, an ablation tool can be directed to a backside 451 of the rotating wafer in specific embodiments. The backside ablation tool directs a stream of fluid to the backside of the wafer at various angles. The stream of fluid covers the backside outer periphery, runs along the edge, and curls back to a selected region of the front-side outer periphery. The fluid stream is adjusted to selectively remove a desired amount of material from the wafer edge. The back-side ablation tool can be used alone by itself. Alternatively, the back-side ablation tool can be used in combination with fluid dispenser 415, which provides a protecting fluid. Additionally, the back-side ablation tool can be used in combination with the front-side ablation tool, such as the one described above. The combination of these tools can be used with the dispensing tool 415, as well as other tools.

Alternatively, the ablation tool can direct an intense or focussed beam or "puck" of plasma to the edge region of the rotating wafer to ablate the edge region in other embodiments. In these embodiments, the ablation apparatus is sealed in a vacuum. That is, the susceptor and various tools are in a chamber, which is maintained under vacuum. The ablation tool provides a focussed beam of material or plasma to ablate an edge region of the rotating wafer. For silicon processing, the plasma can be formed using a variety of compounds such as a chlorine bearing compound or a fluorine bearing compound.

Alternatively, the ablation tool directs a high velocity stream of fluid that physically removes a portion of the edge region of the rotating wafer. The high velocity steam of fluid can be, for example, water or deionized water. In some embodiments, the water is mixed with an abrasive that enhances the ablation process. Additionally, the water and abrasive can be mixed with an acidic or basic solution to further enhance material removal. The high velocity stream of fluid has a source pressure.

Figure 4A:
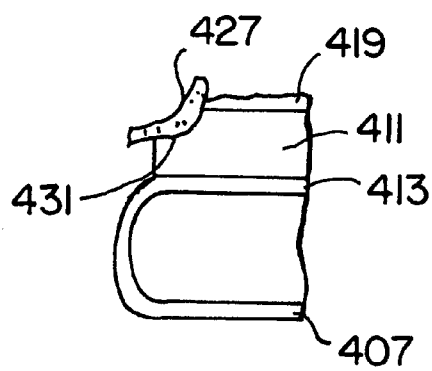

FIG. 4A shows fluid 427 etching a portion 431 of material 411. As shown, fluid selectively flows out from the orifice to region 431 to contact semiconductor material 411. That is, a sheet of fluid comes in contact with region 431, which is removed by chemical and physical mechanisms (e.g. erosion). In most cases, the sheet of fluid is substantially laminar, but may include some turbulent features. To protect material outside of region 431, fluid 419 is used to mask the outside region. In a specific embodiment, fluid 419 is a substantially non-reactive fluid, which masks the region, which should not be removed by the ablating fluid. As merely an example, the non-reactive fluid may include, among others, water, DI wafer, and the like.

In removing material from region 431, one of numerous edge profiles can be provided. These profiles include an outwardly sloping edge profile, which can even have less slope in some embodiments. Alternatively, etching can produce a substantially vertical edge profile, which has an angle of less than 5 degrees variation in other embodiments. Still further, etching can produce a negatively sloped edge profile. The type of profile used depends upon the application, however. The present method can be performed on a system, such as the one shown in FIG. 5.

Figure 5:
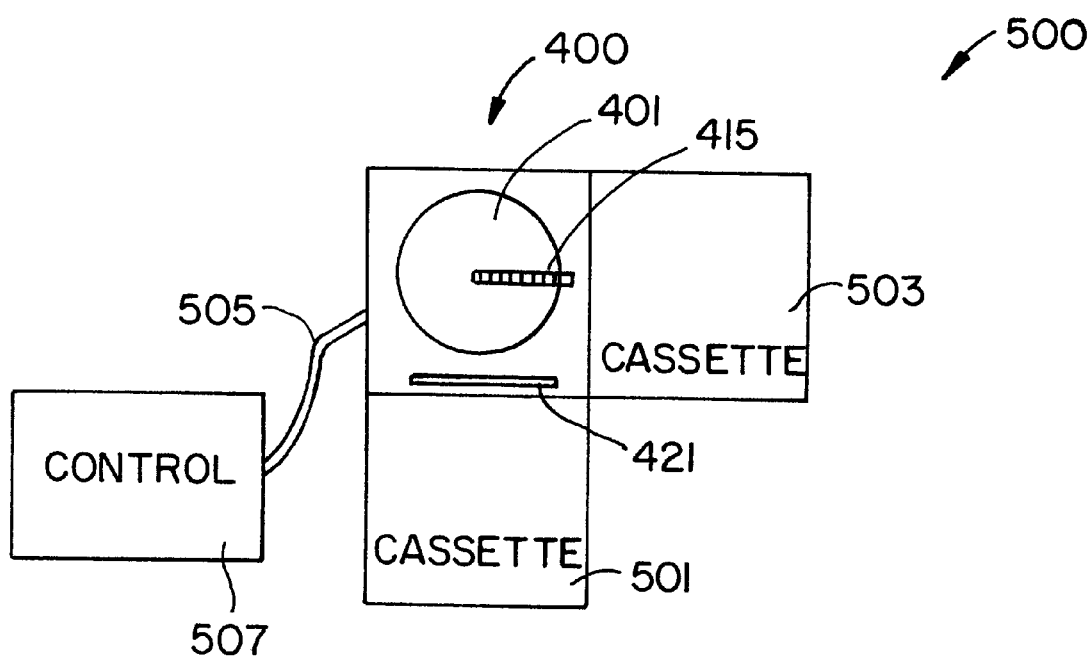
FIG. 5 is a top-view diagram of a system according to an embodiment of the present invention.

FIG. 5 is a top-view diagram of a system 500 according to an embodiment of the present invention. This diagram is merely an illustration and should not limit the scope of the claims herein. One of ordinary skill in the art would recognize other modifications, alternatives, and variations. Like reference numerals are used in the present Fig. as the previous Fig. System 500 is semi- or fully automatic by way of autoloaders, including input device 501 and output device 503. The input devices include cassettes, which are to be for wafers. Wafers at input device have not been processed. Wafers at output device have been processed. System 500 also includes ablation apparatus 400 or sub-system 400. The ablation apparatus 400 includes susceptor 401, which is rotatable, and fluid dispenser 415. The ablation tool 421 is also included. System 500 also includes controller 507, which couples operation of apparatus 400 to input and output devices 501, 503, respectively.

Controller 507 can be any suitable control unit. As merely an example, the control unit should be microprocessor based and have sufficient memory to store numerous process recipes in the form of computer programs or codes. The memory includes dynamic random access memory, flash memory, as well as hard disk storage, and optical storage devices. The controller also includes a graphical user interface ("GUI") for monitoring, programming, and controlling system 500. An input device such as a keyboard or mouse is also included.

A method according to the present invention may be performed as follows:

(1) Provide a cassette of unprocessed wafers;
(2) Load cassette onto an input device;
(3) Pick a wafer to be processed;
(4) Place the wafer onto a susceptor of an ablation apparatus;
(5) Secure wafer onto susceptor;
(6) Rotate wafer to desired speed value;
(7) Apply water onto center region of the wafer;
(8) Direct ablation tool toward edge region of the wafer;
(9) Dispense stream of ablating fluid toward edge region;
(10) Stop stream of ablating fluid upon removal of edge region;
(11) Continue to apply water onto wafer to rinse wafer;
(12) Stop application of water onto wafer;
(13) Continue to rotate wafer to dry wafer;
(14) Stop wafer after drying wafer;
(15) Pick wafer from susceptor;
(16) Transfer wafer to an output device;
(17) Insert wafer into cassette; and
(18) Repeat steps of next wafer.

The above sequence of steps are used to perform edge engineering or ablate a selected portion of an edge region of the wafer. These steps can be performed without the use of a photomasking step, which saves time and reduces the amount of particulate contamination from photoresist. Additionally, the present steps can be performed on a novel ablation apparatus, which has a relatively small foot print and can handle a high volume of wafers. The ablation apparatus is also scalable to larger substrates such as 300 mm substrates and greater in some applications. Details of a method for the present invention using the present system is shown in FIG. 6.

Figure 6:
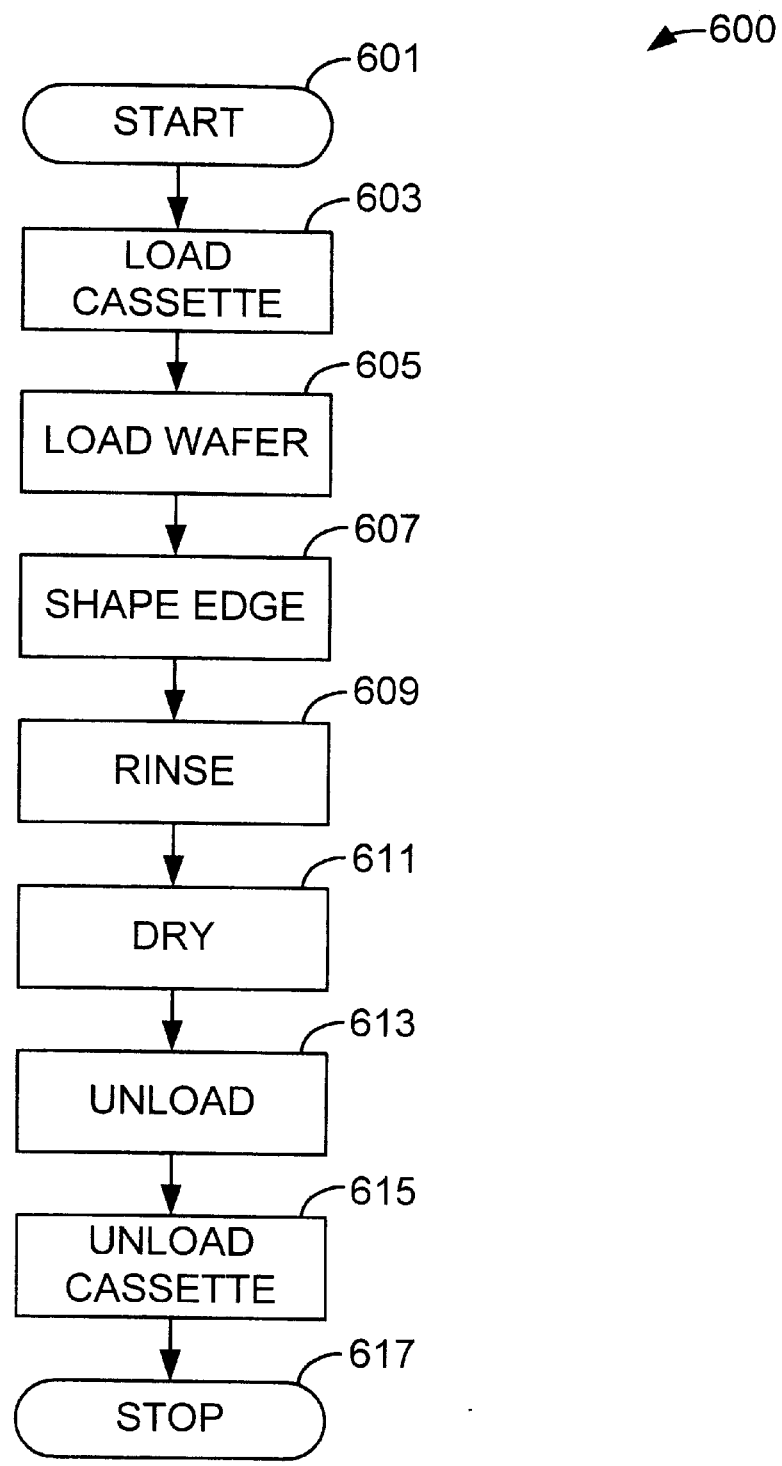
FIG. 6 is a simplified flow diagram of an ablation method according to an embodiment of the present invention.

FIG. 6 is a simplified flow diagram of a non-masking method according to an embodiment of the present invention. This diagram is merely an illustration and should not limit the scope of the claims herein. One of ordinary skill in the art would recognize other modifications, alternatives, and variations. The process begins at a start step 601, which can be performed on the system described above, as well as others. A batch of unprocessed wafers or wafers to be ablated are loaded (step 607) onto a load station. In a specific embodiment, the wafers are SOI wafers, which require edge engineering. That is, an exclusion region must be formed on the outer periphery of the wafer. Alteratively, a variety of other wafers can be used depending upon the application. A handling arm picks a wafer from the cassette and loads (step 605) onto an ablation apparatus. That is, the handling arm picks the wafer up and places the wafer onto a susceptor. The handling arm returns to a home position and the wafer is secured on the susceptor.

A combination of steps are used to shape or engineer an edge region (step 607) of the wafer. These steps generally include rotating the wafer, dispensing a protecting solution over the wafer, dispensing a steam of ablating fluid to selected edge regions, rinsing the wafer, drying the wafer, and others, if necessary.

The susceptor is coupled to a motor or drive which rotates the wafer in a circular manner. The susceptor can be capable of rotating a speeds ranging from low to high. The susceptor also accelerate linearly, exponentially, or in a stepped manner to a steady state speed. The susceptor can also decelerate linearly, exponentially, or in a stepped manner to a steady state speed.

Preferably, the wafer is substantially stationary in the radial and z-direction during rotation. Additionally, susceptor has high accuracy in the z-direction at full speed. Susceptor also has high accuracy in the radial direction at full speed. Accordingly, susceptor is substantially stationary and stable during high rotation speeds, as well as low rotation speeds.

A protecting liquid is dispensed in a center region of the wafer while the wafer rotates. A fluid dispenser, which is disposed overlying the wafer, can dispense the fluid. Fluid dispenser is movable, but is preferably overlying a center region of the wafer. The fluid dispenser is movable in the radial, angular, and z-direction. Fluid dispenser supplies fluid through nozzle. Fluid can be a liquid, which adheres to a top surface of the wafer. Fluid can be applied in a laminar manner or turbulent manner or combinations of laminar and turbulent flow. Alternatively, a spray of fluid can also be applied. The fluid protects regions of the wafer, which should not be subject to ablating.

An ablation tool is directed to the edge region of the wafer for ablating. An ablating fluid streams out of an orifice of the ablation tool to ablate the edge region to form an edge exclusion region on the wafer. Preferably, the edge region is removed without the use of a photomasking or masking step. In a specific embodiment, the ablation tool is disposed overlying a selected edge portion of the rotating wafer. The ablation tool includes a variety of elements such as an inner flow region or orifice, which is coupled to a fluid source. The tool also includes an outer region. Fluid is ejected or dispensed from orifice to the edge portion of the rotating wafer. Fluid can be applied in a laminar manner or turbulent manner or combinations of laminar and turbulent flow. Alternatively, a spray of fluid can also be applied though the spray may cause poor ablation accuracy. In applications where the semiconductor material is a silicon material, the fluid can be a selective etchant such as a combination of a hydrofluoric acid, acetic acid, and nitric acid.

Once a desired amount of material is removed from the wafer edge, the stream of ablating fluid is stopped. A focus laser beam can be used to monitor the reflectivity of the excluded region as end-point detection. The protecting fluid continues to flow onto the wafer as the wafer rotates to rinse (step 609) the wafer. The wafer is rinsed until substantially all the ablation fluid is removed from the wafer in most embodiments.

The method performs a drying step (step 611). Drying occurs by rotating the wafer without any liquid being dispensed on the liquid. In most embodiments, drying can be enhanced by supplying a drying fluid such as clean dry air onto the wafer. Alternatively, clean dry nitrogen gas can be supplied to the wafer. Hot nitrogen gas can also be directed to the wafer to help evaporate any residual fluid from the wafer. The hot nitrogen gas can range in temperature from about 20 to about 150 degrees C. In some cases, the wafer can also be dried by a process called Marangoni drying. Marangoni drying occurs by adding a small amount of a solvent such as alcohol (e.g. IPA) in a carrier gas overlying a region above the wafer as the wafer spins. The solvent enhances the removal of fluid or liquid from the wafer.

After the wafer is dried, the susceptor stops rotating. A handling arm picks (step 613) up the wafer from the susceptor and transfers the wafer into a cassette (step 615) at an output device. In some cases, the wafer must be aligned before being transferred into the carrier. In these cases, the susceptor may align the wafer by reference to the wafer flat. Alternatively, an alignment station can align the wafer. The process then begins again at step 605. Once all the wafers in the cassette have been processed the process stops, step 617.

Optionally, the present method can also be used with back-side ablation. As merely an example, an ablation tool can be directed to a backside outer periphery of the rotating wafer in a specific embodiment. The backside ablation tool directs a stream of fluid to the backside outer periphery of the wafer. The stream of fluid covers the backside outer periphery, runs along the edge, and curls back to a selected region of the front-side outer periphery. The fluid stream is adjusted to selectively remove a desired amount of material from the wafer edge. That is, the fluid stream can be laminar, turbulent, or combinations thereof. The back-side ablation tool can be used alone by itself. Alternatively, the back-side ablation tool can be used in combination with fluid dispenser, which provides a protecting fluid. Additionally, the back-side ablation tool can be used in combination with the front-side ablation tool, such as the one described above. The combination of these tools can be used with the dispensing tool, as well as other tools.

Although the above has been generally described in terms of SOI wafers, the present invention can be applied to a variety of other wafers. For example the present invention can be applied to patterned wafers, bulk wafers, silicon on sapphire wafers, silicon on glass, and other multi-layered structures or substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for fabricating a multi-layered substrate, said method comprising steps of:
   providing a substrate comprising a thickness of material overlying an insulating material, said thickness of material having a surface thereon, said thickness of material extending from an inner portion to an outer periphery of said substrate;
   rotating said substrate about a center region of said substrate such that said surface moves about a fixed plane; and
   directing a stream of material to an outer portion of said thickness of material as said substrate rotates to ablate an outer peripheral portion of said thickness of material that contacts said directed stream of material and to prevent ablation of the thickness of material in the inner portion.

2. The method of claim 1 wherein said stream of material is emitted from a nozzle.

3. The method of claim 1 wherein said stream of material flows in a laminar manner.

4. The method of claim 1 wherein said step of material flows in a turbulent manner.

5. The method of claim 1 wherein said stream of material is free from droplets or spray.

6. The method of claim 1 wherein said stream of material comprises liquid.

7. The method of claim 1 wherein said stream of material comprises a hydrofluoric acid, acetic acid, and nitric acid.

8. The method of claim 7 wherein said hydrofluoric acid, said acetic acid, and said nitric acid are in a selected ratio.

9. The method of claim 1 wherein said substrate comprises silicon.

10. The method of claim 1 wherein said film of material comprises silicon.

11. The method of claim 1 wherein said step of applying selectively removes said portion of said film of material.

12. The method of claim 11 wherein said selective removal is a wet etching process.

13. The method of claim 1 further comprising a step of applying a stream of liquid at said center region of said film of material as said substrate rotates about said center region.

14. The method of claim 1 wherein said thickness of material overlies an insulating layer disposed on said substrate.

15. The method of claim 1 wherein said step of rotating occurs at a selected rate.

16. The method of claim 1 wherein said outer periphery portion is less than about 2 millimeters.

17. The method of claim 1 wherein said ablated portion is oxidized.

\* \* \* \* \*